United States Patent
Bulja

(10) Patent No.: US 9,887,688 B2
(45) Date of Patent: Feb. 6, 2018

(54) FILTER ASSEMBLY AND A METHOD OF FILTERING

(71) Applicant: Alcatel Lucent, Boulogne Billancourt (FR)

(72) Inventor: Senad Bulja, Blanchardstown (IE)

(73) Assignee: Provenance Asset Group LLC, Essex, CT (US)

( * ) Notice: Subject to any disclaimer, the term of this patent is extended or adjusted under 35 U.S.C. 154(b) by 0 days.

(21) Appl. No.: 14/442,776

(22) PCT Filed: Oct. 23, 2013

(86) PCT No.: PCT/EP2013/003190
§ 371 (c)(1),
(2) Date: May 14, 2015

(87) PCT Pub. No.: WO2014/075760
PCT Pub. Date: May 22, 2014

(65) Prior Publication Data
US 2015/0311882 A1 Oct. 29, 2015

(30) Foreign Application Priority Data
Nov. 16, 2012 (EP) .................................... 12290396

(51) Int. Cl.
*H03H 11/12* (2006.01)
*H03H 7/01* (2006.01)
(Continued)

(52) U.S. Cl.
CPC ........... *H03H 11/12* (2013.01); *H01P 1/2039* (2013.01); *H01P 1/2056* (2013.01); *H03H 2/00* (2013.01);
(Continued)

(58) Field of Classification Search
CPC .......... H04B 1/525; H04B 1/005; H04B 1/16; H03H 2007/013; H03H 9/547; H03H 9/6409; H03H 11/12
(Continued)

(56) References Cited

U.S. PATENT DOCUMENTS 4,450,417 A * 5/1984 Folkmann ............ H03H 11/367
330/124 R
5,132,651 A   7/1992 Ishikawa et al.
(Continued)

FOREIGN PATENT DOCUMENTS

CN   1 776 957 A   5/2006
CN   102571655 A   7/2012
(Continued)

OTHER PUBLICATIONS

International Search Report for PCT/EP2013/003190 dated Feb. 6, 2014.
(Continued)

*Primary Examiner* — Dean Takaoka
*Assistant Examiner* — Alan Wong
(74) *Attorney, Agent, or Firm* — Fay Sharpe, LLP

(57) ABSTRACT

A filter assembly is provided comprising a first filter (12), a notch filter (26, 26'), and a phase-shifter (36). The first filter has a stop-band. The filter assembly is configured to, in use, split the output of the first filter into a main signal on a first path (18, 20, 22) and a secondary signal on a parallel path (26, 36, 38), and to pass the signal on the parallel path through the notch filter (26) having a stop-band corresponding to the pass-band of the first filter and, or including, through the phase-shifter (36) so as to be phase-shifted at least substantially into anti-phase to the main signal to provide an adjustment signal $\Phi_f(\omega)$. The filter assembly is further configured to combine (22) the adjustment signal
(Continued)

with the main signal so as to provide the main signal attenuated in the stop-band.

18 Claims, 4 Drawing Sheets

(51) Int. Cl.
    *H01P 1/203* (2006.01)
    *H01P 1/205* (2006.01)
    *H03H 2/00* (2006.01)
    *H03H 11/04* (2006.01)

(52) U.S. Cl.
    CPC ......... *H03H 7/01* (2013.01); *H03H 2007/013* (2013.01); *H03H 2011/0488* (2013.01)

(58) Field of Classification Search
    USPC ........................................ 333/24 R, 1.1, 24.2
    See application file for complete search history.

(56) References Cited

U.S. PATENT DOCUMENTS

| | | | |
|---|---|---|---|
| 5,721,521 A | 2/1998 | Drabeck et al. | |
| 7,545,240 B2* | 6/2009 | Morga | H01P 1/2056 333/202 |
| 8,385,871 B2* | 2/2013 | Wyville | H03H 11/344 330/151 |
| 9,020,065 B2* | 4/2015 | Wyville | H04B 1/0475 333/24 R |
| 9,425,840 B2* | 8/2016 | Kintis et al. | H04B 1/1036 |
| 2002/0130716 A1 | 9/2002 | Larson et al. | |
| 2006/0273869 A1 | 12/2006 | Jachowski | |
| 2007/0207768 A1 | 9/2007 | So et al. | |
| 2008/0139142 A1 | 6/2008 | Kayano et al. | |
| 2009/0309649 A1 | 12/2009 | Tsuyama | |
| 2014/0328222 A1 | 11/2014 | Mao et al. | |

FOREIGN PATENT DOCUMENTS

| | | |
|---|---|---|
| JP | S56 144621 A | 11/1981 |
| JP | H04 260213 A | 9/1992 |
| JP | 2001-217669 | 8/2001 |
| JP | 2008-147959 | 6/2008 |
| JP | 2010-153937 A | 7/2010 |

OTHER PUBLICATIONS

J. S. Hong, et al., "Microstrip Filters for RF/Microwave Applications," John Wiley & Sons, ISBN: 0-471-38877-7, pp. 69-76, 2001.

Lye Heng Chua, "Triple-mode dielectric loaded cubical cavity filters," PH.D. dissertation, 2004, Essex University, United Kingdom, 184 pages, 2004.

L. Young, et al., "Microwave band-stop filters with narrow stop bands," *IEEE Trans Microwave Theory Tech.*, vol. MTT-10, pp. 416-427, Nov. 1962.

B. M. Schiffman, et al., "Exact design of band-stop microwave filters," *IEEE Trans. Microwave Theory Tech.*, vol. MTI-12, pp. 6-15, Jan. 1964.

H. C. Bell, "L-Resonator bandstop filters," *IEEE Trans Microwave Theory Tech.*, vol. 44, No. 12, pp. 2669-2672, Dec. 1996.

N. Sato, "Coupled-line filters," in *Microwave Filters and Circuits*, A Matsumoto, Ed. New York Academic, 1970, pp. 179-224.

H. S. Black, "Stabilised feed-back amplifiers," Transactions of American Institute of Electrical Engineers, vol. 53, Issue 1, pp. 114-120, 1934.

CTS Corporation, leading designer and manufacturer of sensors, actuators and electronic components to OEMs in the aerospace, communications, defense, industrial, information technology, medical and transportation markets, internet citation www.ctscorp.com, Jan. 15, 2016; cover page only.

\* cited by examiner

Band-stop filters with (a) capacitive and (b) with parallel couplings

FILTERED INPUT SIGNAL

REPLICA SIGNAL

MAIN SIGNAL

CORRECTION SIGNAL

RESULTANT SIGNAL

FILTER ASSEMBLY AND A METHOD OF FILTERING

FIELD OF THE INVENTION

The present invention relates to a filter assembly and filtering, for example for telecommunications.

DESCRIPTION OF THE RELATED ART

Filters are widely used in telecommunications. Their applications include in base stations, in radar systems, in amplifier linearization, in point-to-point radio and in RF signal cancellation, to name but a few. Which filter to use depends on the application but there are certain desirable characteristics that filters share. For example, the amount of insertion loss in the pass-band of a filter should be as low as possible whilst the attenuation in the stop-band should be high as possible. Furthermore, in some applications, the guard band, which is the frequency separation between the pass-band and stop-band, needs to be very small. This requires a filter of high order to be deployed. A high order filter is, of course, one that includes a high number of resonators. A high order filter is, of course, more technically complex and large than a corresponding filter of a lower order. Furthermore, even though increasing the order of the filter increases the attenuation in the stop-band, it inevitably increases attenuation in the pass-band too.

Generally, a demand for higher attenuation in the stop-band is driven by demands for higher isolation between transmit and receive channels. Accordingly, much attention is focussed on techniques that allow the insertion of a transmission zero, also known as a notch, in the response of the filter. This transmission zero is normally introduced in the stop-band of the filter so that attenuation is increased.

The transmission zero can in introduced in a variety of ways depending in the type of filter. For example, in cavity filters, the transmission zero is introduced by providing additional coupling between the non-adjacent cavities of the filter. This coupling causes the transmission zero in the filter's response and its exact position of the transmission zero is dependent on the parameters of the particular filter's circuitry.

On the other hand, for surface mount technology filters, the best way to implement a transmission zero is less obvious. One known approach is to take advantage of the cascade connection of a band-stop (notch) filter with a filter into which a transmission zero needs to be inserted. However, this approach is difficult as it depends on the quality (Q) factor of the notch filter, which itself represents the effect of the transmission zero on the overall performance of the filter, in particular its insertion loss in the pass-band.

Two known ways of realising a notch using surface mount technology are shown in FIG. 1. The filter shown in FIG. 1(a) consists of a microstrip line 2 coupled to grounded band-stop resonators 4 by capacitive gaps 6. The filter shown in FIG. 1(b) consists of a microstrip line 2' coupled to grounded band-stop resonators 4' by parallel line couplings 8. The number of grounded resonators 4,4' depends on the number of desired transmission zeros. A known refinement of this approach is where the open port of a grounded resonator is terminated by a reactance. This allows reduced size but with an increase of insertion loss, due to the finite Q factor of that connected reactance.

SUMMARY

The reader is referred to the appended independent claims. Some preferred features are laid out in the dependent claims.

An example of the present invention is a filter assembly comprising a first filter, a notch filter, and a phase-shifter. The first filter has a stop-band. The filter assembly is configured to, in use, split the output of the first filter into a main signal on a first path and a secondary signal on a parallel path, and to pass the signal on the parallel path through the notch filter having a stop-band corresponding to the pass-band of the first filter and, or including, through the phase-shifter so as to be phase-shifted at least substantially into anti-phase to the main signal to provide an adjustment signal. The filter assembly is further configured to combine the adjustment signal with the main signal so as to provide the main signal attenuated in the stop-band.

Preferred embodiments provide a filter assembly having both a high stop-band attenuation and a low pass-band insertion loss.

Preferred embodiments may be considered as feed-forward filters with a broad transmission zero, in other words a broad and deep notch. Preferred embodiments provide improved attenuation in the stop-band with little change in pass-band insertion loss.

The present invention also relates to corresponding methods.

BRIEF DESCRIPTION OF THE DRAWINGS

Embodiments of the present invention will now be described by way of example and with reference to the drawings, in which.

DETAILED DESCRIPTION

Figure 1:
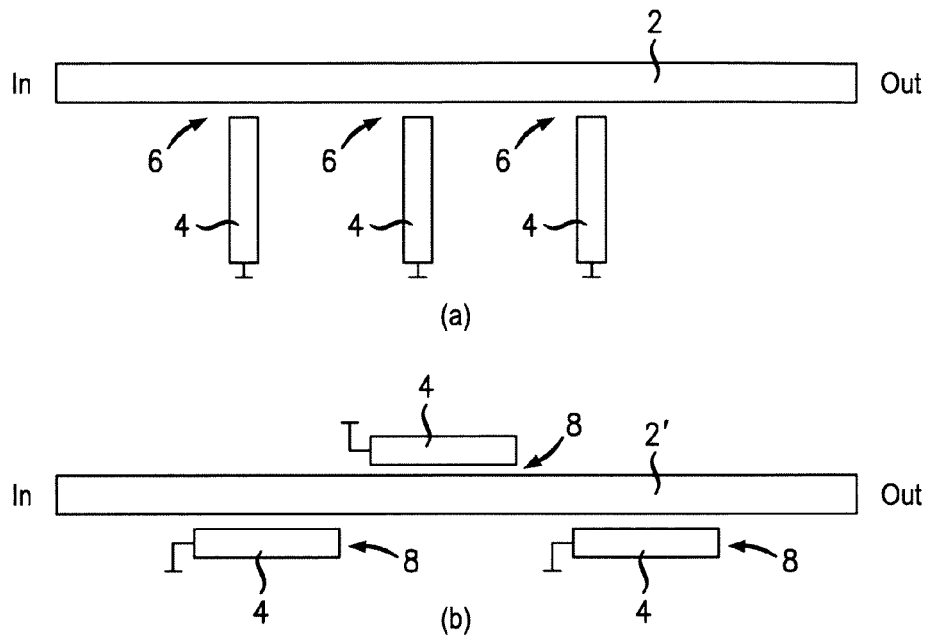
FIG. 1 is a diagram illustrating two known filters (PRIOR ART)

When considering the known approach shown in FIG. 1, the inventor realised that a drawback of this known approach is that the introduced transmission zero is small and one would need to introduce several such transmission zeros next to each other to significant improve the stop-band attenuation. However this would have the disadvantage of increasing the insertion loss in the pass-band.

The inventor realised that it would be possible to introduce a broad transmission zero (also known as a notch) into a filter assembly's attenuation characteristic by coupling a small part of the signal output from a ceramic filter into a notch filter block. This is in order to produce a signal which, in the stop-band, is similar in magnitude but in anti-phase to the main signal output from the ceramic filter. The main signal and correction signal are then combined. In consequence, there is little increase in insertion loss but significant extra attenuation in the stop-band. This can be considered as a "feed-forward" correction.

Filter Assembly

Figure 2:
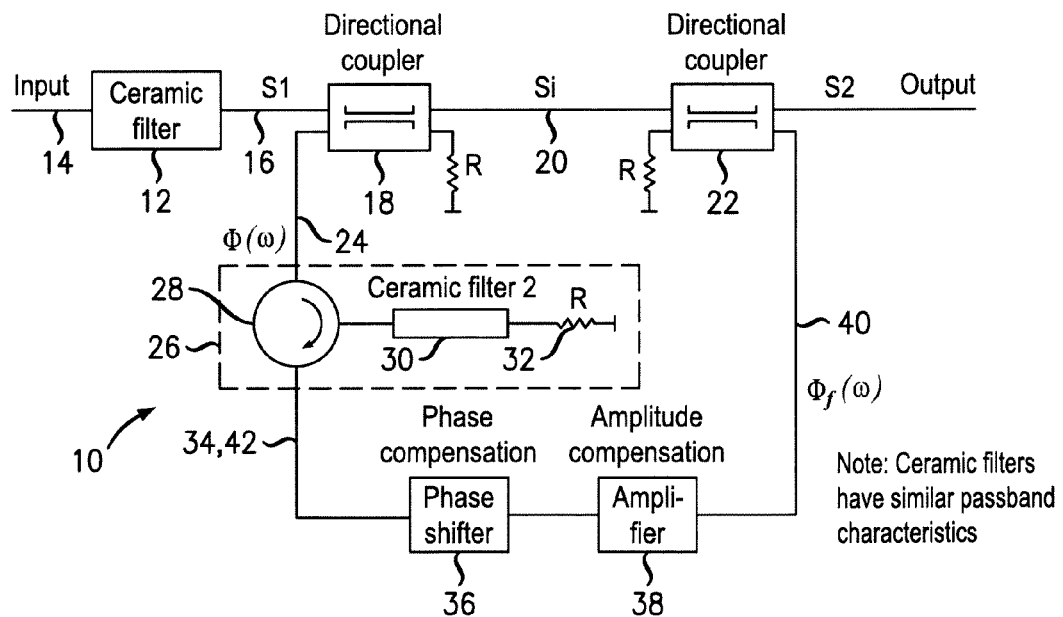
FIG. 2 is a diagram illustrating a filter according to a first embodiment of the present invention.

More specifically, as shown in FIG. 2, a filter assembly 10 includes a first ceramic filter 12 having an input 14 and an output 16. The inventor considered that ceramic filter 12 has an acceptably low insertion loss but itself provides insufficient attenuation in the stop-band. The output 16 is connected to a first loosely-coupled directional coupler 18. The main output 20 of directional coupler 18 is connected to a second directional coupler 22 and a secondary output 24 of directional coupler 18 is connected to a notch filter block 26. The notch filter block 26 has its pass-band at the location of the stop-band of the first ceramic filter 12. The stop-band of the notch filter block 26 is the same range of frequencies as the pass-band of the first ceramic filter 12. In this example, the notch filter block 26 includes a circulator 28, a second ceramic filter 30 and a resistor 32. The secondary output 24 of directional coupler 18 is connected to the circulator 28.

The output 34 of the circulator 28 is connected to a frequency dependent phase shifter 36 which is connected to an amplifier 38. The amplifier 38 has an output 40 which is provided as an input to the second directional coupler 22.

The first ceramic filter 12 and the second ceramic filter 30 have similar pass-band characteristics.

Operation

The operation of the filter assembly shown in FIG. 2 is as follows.

The ceramic filter 12 filters its input signal to provide a filtered output signal S1 at its output 16.

The filtered signal S1 is then passed to the directional coupler 18 which has a very low attenuation in the main output signal Si provided at output 20 but creates a relatively low power replica signal, denoted $\Phi_r(\omega)$ at its secondary output 24, of the filtered signal S1.

The replica signal $\Phi_r(\omega)$ is then passed through the notch filter 26 to provide at the notch filter output 34 a processed signal 42 that is greatly attenuated in the pass-band of the second filter 30 but has minimal effect in its pass-band. The processed signal 42 is then phase-adjusted in the phase shifter 36 and then amplified by amplifier 38, and the resultant signal $\Phi_f(\omega)$ is fed to the second directional coupler 22.

In the second directional coupler 22, the main signal Si and the correction signal $\Phi_f(\omega)$ are combined to provide an output signal S2. In the pass-band the correction signal $\Phi_f(\omega)$ is relatively small and so has little or no effect on the insertion loss performance. However, in the stop-band the correction signal $\Phi_f(\omega)$ is, as intended, basically equal in magnitude and in antiphase to the main signal Si. This results in a greater stop-band attenuation, as is desirable. In consequence, a sharp stop-band attenuation characteristic is seen as a function of frequency going between pass-band and stop-band.

As regards some implementation details, in the example shown in FIG. 2, the gain of the amplifier 38 is the sum of the coupling of the first directional coupler 18 and the coupling of the second directional coupler 22, where coupling here is a known measure of the proportion of the main signal input to a directional coupler that is output or input via a secondary port.

Furthermore, the power of the signal in the 'feed-forward' branch, namely via the notch filter 26, phase shifter 38 and amplifier 38, prior to the second directional coupler 22, specifically correction signal $\Phi_f(\omega)$, is about 10 dB below the main signal Si. This enables the amplifier 38 to be low power and to provide an output signal S2 which is of good linearity.

Still furthermore, the phase of the correction signal $\Phi_f(\omega)$ is controlled to be in anti-phase with the phase of the replica signal $\Phi_r(\omega)$ in the feed-forward branch in the frequency range where increased attenuation is sought. This may be represented as $$\Phi_f(\omega) = \Phi_r(\omega) + K, \text{ where } K \text{ is a constant.}$$

To illustrate further, examples of the signals in the filter shown in FIG. 2 are shown in FIGS. 3 to 7.

Figure 3:
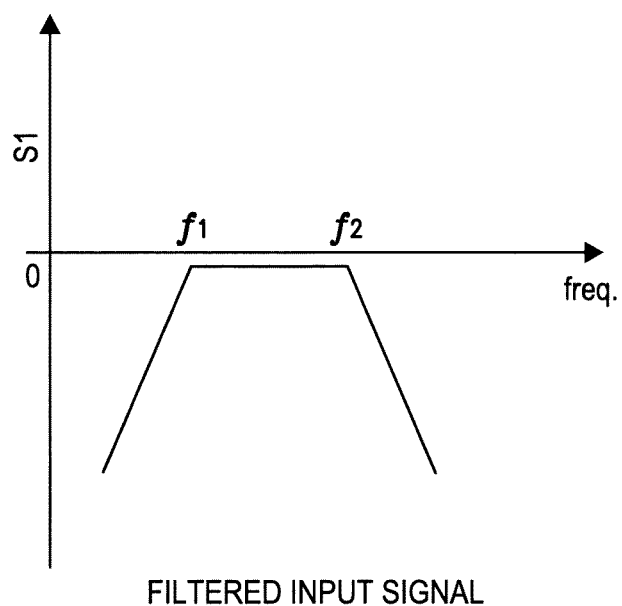
FIG. 3 illustrates schematically the signal S1 as a function of radio frequency, in the filter shown in FIG. 2.

FIG. 3 illustrates schematically the signal S1 from ceramic filter 12 as a function of radio frequency. The passband of the ceramic filter 12 is the frequency range f1 to f2.

Figure 4:
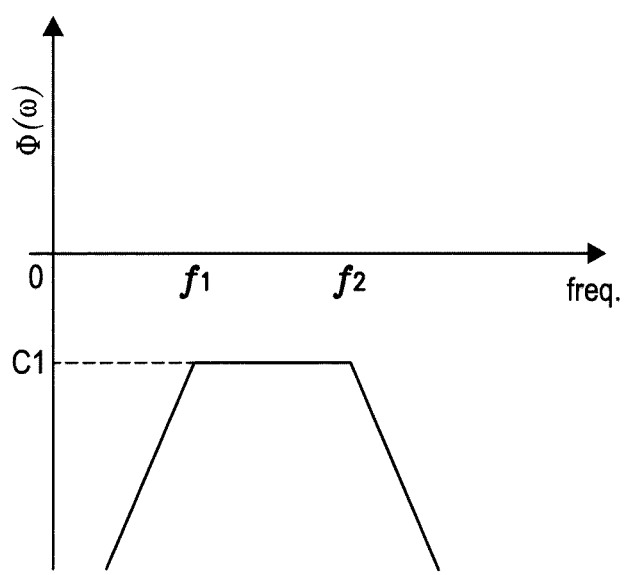
FIG. 4 illustrates schematically the signal $\Phi_f(\omega)$ as, a function of radio frequency, in the filter shown in FIG. 2.

FIG. 4 illustrates schematically the replica signal $\Phi_r(\omega)$ as a function of radio frequency. The coupling of the first directional coupler 18 is illustrated as level C1.

Figure 5:
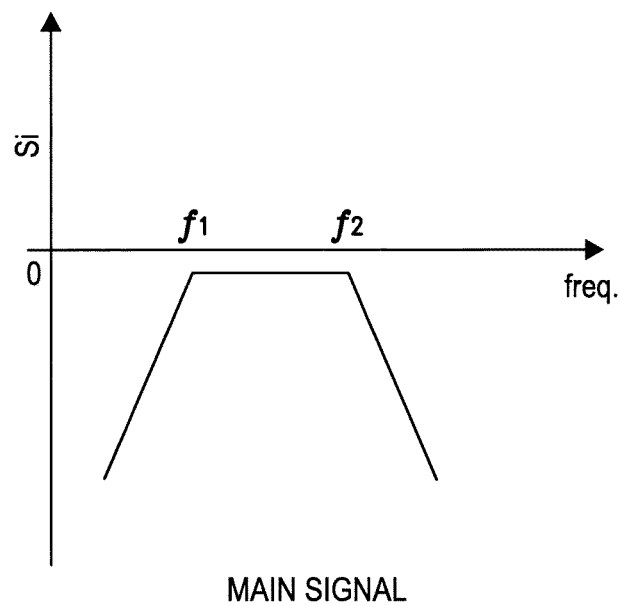
FIG. 5 illustrates schematically the signal S1 as a function of radio frequency, in the filter shown in FIG. 2.

FIG. 5 illustrates schematically the main signal Si as a function of radio frequency. This is very similar to S1 as a function of frequency that is shown in FIG. 4.

Figure 6:
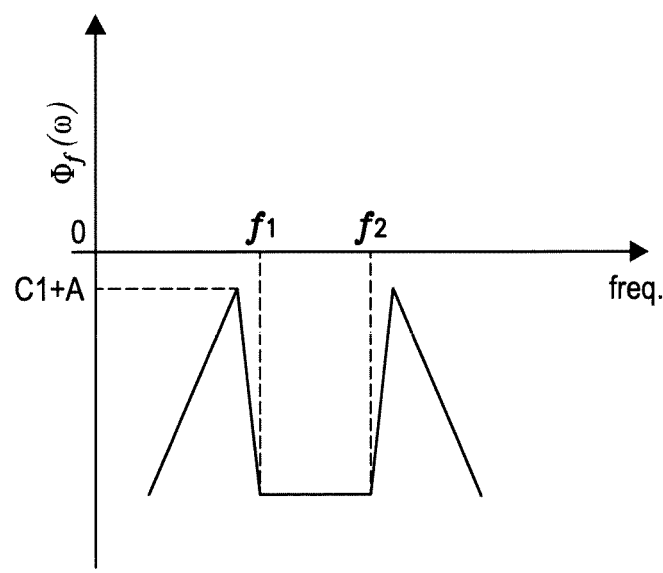
FIG. 6 illustrates schematically the signal $\Phi_f(\omega)$ as a function of radio frequency, in the filter shown in FIG. 2.

FIG. 6 illustrates schematically the correction signal $\Phi_f(\omega)$ as a function of radio frequency. The coupling of the first directional coupler 18 is indicated by C1 and the amplification is shown by a change in amplitude of C1+A, where A is the amplifier's gain.

Figure 7:
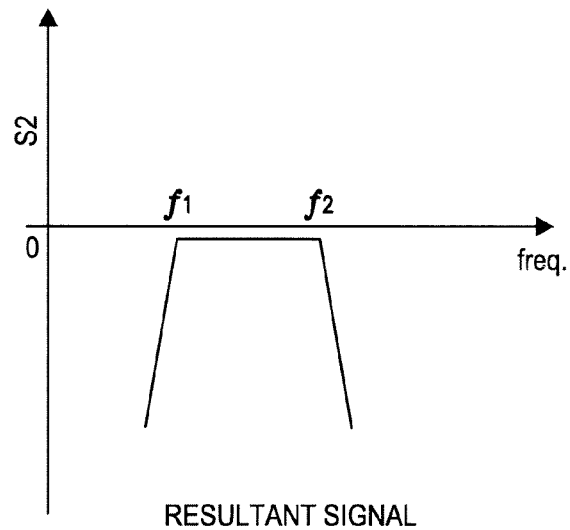
FIG. 7 illustrates schematically the signal S2 as a function of radio frequency, in the filter shown in FIG. 2.

FIG. 7 illustrates schematically the resultant signal S2 as a function of radio frequency. The "narrowing" of the "shoulders" compared to FIG. 3 is evident.

An Alternative Filter Assembly

Figure 8:
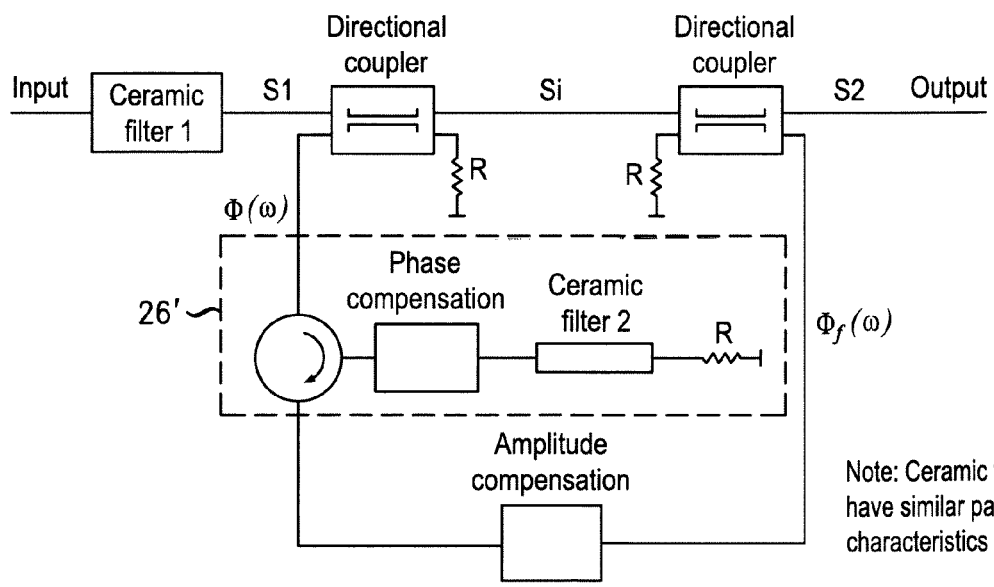
FIG. 8 is a diagram illustrating a filter according to a second embodiment of the present invention.

As shown in FIG. 8, in an alternative example which is otherwise similar to the FIG. 2 example, the frequency dependent phase shifter 36 is instead connected between the circulator 28' and second ceramic filter 30' in the notch filter 26'. This integration of the phase compensation into the notch filter effectively compensates for any unwanted changes in phase due to the circulator 28'.

The FIG. 8 example may be considered an alternative realisation of the feed-forward filter shown in FIG. 2. In the FIG. 8 example, (as for the FIG. 2 example), the signals S1, $\Phi_r(\omega)$, Si and $\Phi_f(\omega)$ are as shown schematically in FIGS. 3 to 7.

Some Further Alternative Embodiments

In the examples described above with reference to FIGS. 2 to 8 the phase compensation is done in the Radio Frequency domain. In some alternative examples (not shown) the phase compensation is done in the digital domain. This enables the bandwidth of the high attenuation stop-band to be extended.

General

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

The invention claimed is:

1. A filter assembly comprising a first filter, a notch filter, and a phase-shifter, the first filter having a pass-band and a stop-band, the filter assembly being configured to, in use, split the output of the first filter into a main signal on a first path and a secondary signal on a second path, and to pass the signal on the second path through the notch filter having a stop-band corresponding to the pass-band of the first filter and through the phase-shifter so as to be phase-shifted at least substantially into anti-phase to the main signal to provide an adjustment signal, the filter assembly further being configured to combine the adjustment signal with the main signal so as to provide the main signal attenuated in the stop-band of the first filter.

2. A filter assembly according to claim 1, in which the notch filter comprises a circulator, a second filter, and a resistor, the circulator being connected to the second filter which is connected to the resistor.

3. A filter assembly according to claim 2, in which the first filter and the second filter have similar pass-band characteristics.

4. A filter assembly according to claim 1, in which the first filter comprises a ceramic filter and the second filter comprises a ceramic filter.

5. A filter assembly according to claim 1, in which the notch filter (26') includes the phase-shifter.

6. A filter assembly according to claim 1, in which, in use, the signal from the notch filter is amplified by an amplifier.

7. A filter assembly according to claim 1, in which, in use, the splitting is performed by a first directional coupler and the combining is performed by a second directional coupler.

8. A filter assembly according to claim 7, in which, in use, the signal from the notch filter is amplified by an amplifier and the amplifier has a gain corresponding to the coupling of the first directional coupler plus the coupling of the second directional coupler, where coupling is a measure of the proportion of the main input/output to a respective directional coupler provided at a secondary port of the respective directional coupler.

9. A filter assembly according to claim 1, in which the adjustment signal has an amplitude 10 dB below the amplitude of the main signal.

10. A filter assembly according to claim 1, in which, in use, the secondary signal is altered by 180 degrees in phase by the phase-shifter to provide the adjustment signal.

11. The filter assembly according to claim 1, wherein the phase-shifter is a frequency dependent phase-shifter.

12. A method of filtering a signal, the method comprising:
filtering by a first filter having a pass-band and a stop-band;
splitting the output of the first filter into a main signal on a first path and a signal on a second path;
providing an adjustment signal by passing the signal on the second path through a notch filter having a stop-band corresponding to the pass-band of the first filter, and phase-shifting the signal on the second path at least substantially into anti-phase to the main signal;
combining the adjustment signal with the main signal so as to provide the main signal attenuated in the stop-band of the first filter.

13. A filter assembly according to claim 1, in which the second path is an electrically parallel path.

14. A filter assembly according to claim 1, in which the notch filter includes the phase shifter.

15. A filter assembly according to claim 1, in which the notch filter does not include the phase shifter.

16. A method of filtering a signal according to claim 11, in which the second path is an electrically parallel path.

17. A method of filtering a signal according to claim 11, in which the passing the signal through the notch filter includes the phase shifting.

18. A method of filtering a signal according to claim 11, in which the passing the signal through the notch filter does not include the phase shifting.

* * * * *